(12) United States Patent
How

(10) Patent No.: US 9,385,717 B1
(45) Date of Patent: Jul. 5, 2016

(54) LEVEL-SENSITIVE TWO-PHASE SINGLE-WIRE LATCH CONTROLLERS WITHOUT CONTENTION

(71) Applicant: Altera Corporation, San Jose, CA (US)

(72) Inventor: Dana How, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/291,487

(22) Filed: May 30, 2014

(51) Int. Cl.
  *H03K 19/0175* (2006.01)
  *H03K 19/094* (2006.01)

(52) U.S. Cl.
  CPC .................................. *H03K 19/0175* (2013.01)

(58) Field of Classification Search
  None
  See application file for complete search history.

(56) References Cited

U.S. PATENT DOCUMENTS

| 5,937,177 A * | 8/1999 | Molnar et al. ................. 712/200 |
| 7,971,038 B2 * | 6/2011 | Wielage ........................ 712/225 |
| 2012/0128037 A1 * | 5/2012 | Coates et al. ................. 375/211 |
| 2013/0080815 A1 * | 3/2013 | Sutherland .................... 713/400 |

OTHER PUBLICATIONS

Sutherland, I., et al., "GasP: A Minimal FIFO Control", IEEE, pp. 46-53, 2001.

* cited by examiner

*Primary Examiner* — Anh Tran
(74) *Attorney, Agent, or Firm* — Fletcher Yoder P.C.

(57) ABSTRACT

Systems and methods are described for a contention-free single-wire latch controller that includes first and second bidirectional signal pins (e.g., the L and R pins in the FIGS), a latch enable output pin (or signal), E, and a decision element (such as a NAND or a NOR gate). A first driving transistor may be coupled between the first bidirectional signal pin and a power rail. A second driving transistor may be coupled between the second bidirectional signal pin and the power rail. A first half-latch may be coupled to the first bidirectional signal pin. A second half-latch may be coupled to the second bidirectional signal pin.

18 Claims, 6 Drawing Sheets

| Node | Time→ | | | | | | | | | | | | | |
|---|---|---|---|---|---|---|---|---|---|---|---|---|---|---|
| ../L1 | 1 | 0 | 0 | 0 | 0 | 0 | 1 | 1 | 1 | 1 | 1 | 1 | 1 | 1 |
| R1/L2 | 1 | 1 | 1 | 1 | 0 | 0 | 0 | 0 | 0 | 1 | 1 | 1 | 1 | 1 |
| R2/L3 | 1 | 1 | 1 | 1 | 1 | 1 | 1 | 0 | 0 | 0 | 0 | 0 | 1 | 1 |
| R3/.. | 1 | 1 | 1 | 1 | 1 | 1 | 1 | 1 | 1 | 1 | 0 | 0 | 0 | 0 |

LEVEL-SENSITIVE TWO-PHASE SINGLE-WIRE LATCH CONTROLLERS WITHOUT CONTENTION

BACKGROUND OF THE INVENTION

This disclosure relates generally to the area of handshaking-based pipeline architectures and to other pipeline architectures with latch controllers.

The core of a field-programmable gate array (FPGA) consists of programmable logic components including lookup tables (LUTs) and flip-flops, as well as "hard" components such as IOs, memories, and DSP blocks. Conventionally, these have been used to build cycle-accurate pipelined machines. As performance targets increase, these machines become more and more pipelined in order to meet the increased operating frequency (i.e. decreased cycle time) requirements. The pipelines make use of register stages that pass data from one stage to the next, with latch controllers in between the registers that determine when data is to pass from one stage to the next.

As will be explained in greater detail below, in a handshaking-based pipeline, data transfers may be synchronized using latch controllers that send forward-going request events and reverse-going acknowledgment events using a bidirectional inter-stage control wire, to which the controllers are attached. The simple and fast implementation may include a "keeper" device attached to the bidirectional wire to retain the state of the wire in between events (retain the state when neither the sender is announcing new data nor the receiver is announcing the consumption of the data). However, these keeper devices "fight" new events and cause contention on the bidirectional wire. In addition, the keeper devices may create issues during layout of the device on which they reside, and the keeper devices may also increase crowbar current.

A handshaking-based pipeline allows data to progress forward at a locally appropriate rate, using what may be in effect locally-generated clocks for each register stage. Thus, it does not require low-skew globally-distributed clocks. Instead, adjacent stages communicate using forward-going request signals and reverse-going acknowledge signals, using one of two basic protocols. In the two-phase protocol, any transition on request indicates data is available, and any transition on acknowledge indicates the data has been consumed. In the four-phase protocol, a HIGH signal on request indicates data is available, and a subsequent HIGH signal on acknowledge indicates the data has been consumed. This cycle is repeated for a LOW signal (i.e., a LOW signal on request and a subsequent LOW signal on acknowledge) before the next data can flow forward. The two-phase protocol has the advantage of half the round-trip handshakes as the four-phase protocol. However, the four-phase protocol is level-sensitive, which results in simpler circuitry than the two-phase protocol.

The two-phase protocol and the four-phase protocol may be combined into a hybrid protocol, which may be used with a single wire. In this single-wire protocol, the producer (the pipeline stage producing data) raises a bidirectional request/acknowledge signal HIGH to indicate new data is available, and then the consumer (the pipeline stage consuming data) lowers the signal to indicate that the data has been consumed. Unfortunately, when neither producer nor consumer forces the state of the request/acknowledge signal, the producer and the consumer should each remember its previous state. Thus, a full latch "keeper" device may be required that will remember the previous state of the producer and consumer and that will contend against drivers that may be active. There may be difficulty in determining where such a keeper device may be placed. For example, the keeper device may be placed in the middle of the producer and consumer, which may require the use of a separate island of transistors. As another example, the keeper device may be placed by one of the consumer or the producer, which may result in a skewed response during the transitions in state of either the producer or the consumer. Thus, it would be desirable to have a controller/keeper device that avoids contention (e.g. with drivers) and one that provides a balanced response during transitions in pipeline stage states.

SUMMARY

Conventional design of single-wire handshaking between stages of a handshaking-based pipeline has focused on including the above-mentioned keepers. However, an aspect of this disclosure refers to the modification of the keeper devices so that they may avoid contention, thereby decreasing power consumption, and increasing performance. For example, instead of including one general-purpose keeper device in between each pipeline stage, the keeper may be split into two half-keepers, or half-latches, which may be attached to the left and right pipeline stages, as described below. The keeper devices may be made tristatable.

When a driver at one end of the single-wire sends an event, the driver device may force the wire to a proper logic level, and may tri-state its neighboring half keeper, which may be responsible for "keeping" the opposite polarity on the wire. In this manner, any contention on the wire may be avoided.

Aspects of this disclosure may allow for the simplest and highest performing handshaking circuitry to be used in a pipeline, without incurring disadvantages such as, for example, a high power overhead and/or possible reliability issues resulting from the contention seen in previous conventional approaches.

Accordingly, systems and methods are described for a contention-free single-wire latch controller that includes first and second bidirectional signal pins (e.g., the L and R pins in the FIGS), a latch enable output pin (or signal), E, a decision element (such as a NAND or a NOR gate). A first driving transistor may be coupled between the first bidirectional signal pin and a power rail. A second driving transistor may be coupled between the second bidirectional signal pin and the power rail. A first half-latch may be coupled to the first bidirectional signal pin. A second half-latch may be coupled to the second bidirectional signal pin.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

Figure 1:
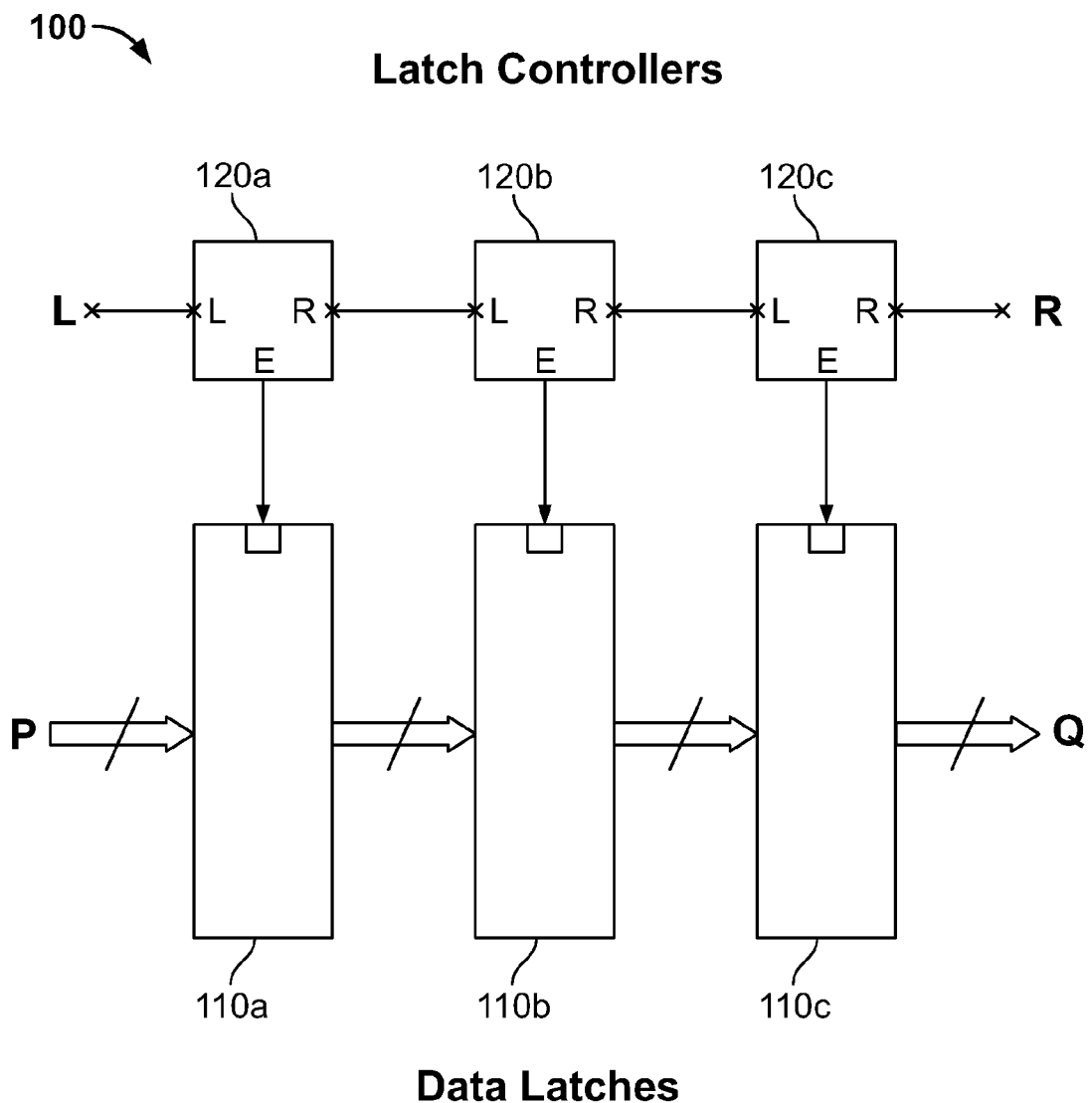
FIG. 1 shows a simplified block diagram of a handshaking-based pipeline that includes data latches and latch controllers according to some embodiments.

FIG. 1 shows a simplified block diagram of handshaking-based pipeline 100 that include data latches 110 and latch controllers 120 according to some embodiments. In pipeline 100, data may move from left to right through the latches on the bottom (i.e., data latches 110). Each of latch controllers 120 above the respective one of the data latches 110 may provide clocking to that respective data latch. Each of the latch controllers 120 may coordinate with the other latch controllers 120 by sending request and acknowledge signals through the bidirectional wires that interconnect the controllers. In a conventional synchronous pipeline system, latch controllers may instead simply provide inverted and uninverted copies of a global clock signal to data latches. In the handshaking-based pipeline system, such as pipeline 100, each of the latch controllers 120 locally generate latch clocks as their own state and their neighbors' states (i.e., the state of a latch controller connected to the left and/or to the right of each latch controller) indicate. For example, latch controller 120b may generate a latch clock for data latch 110b based on the states of latch controllers 120a and 120c.

Figures 2, 3:
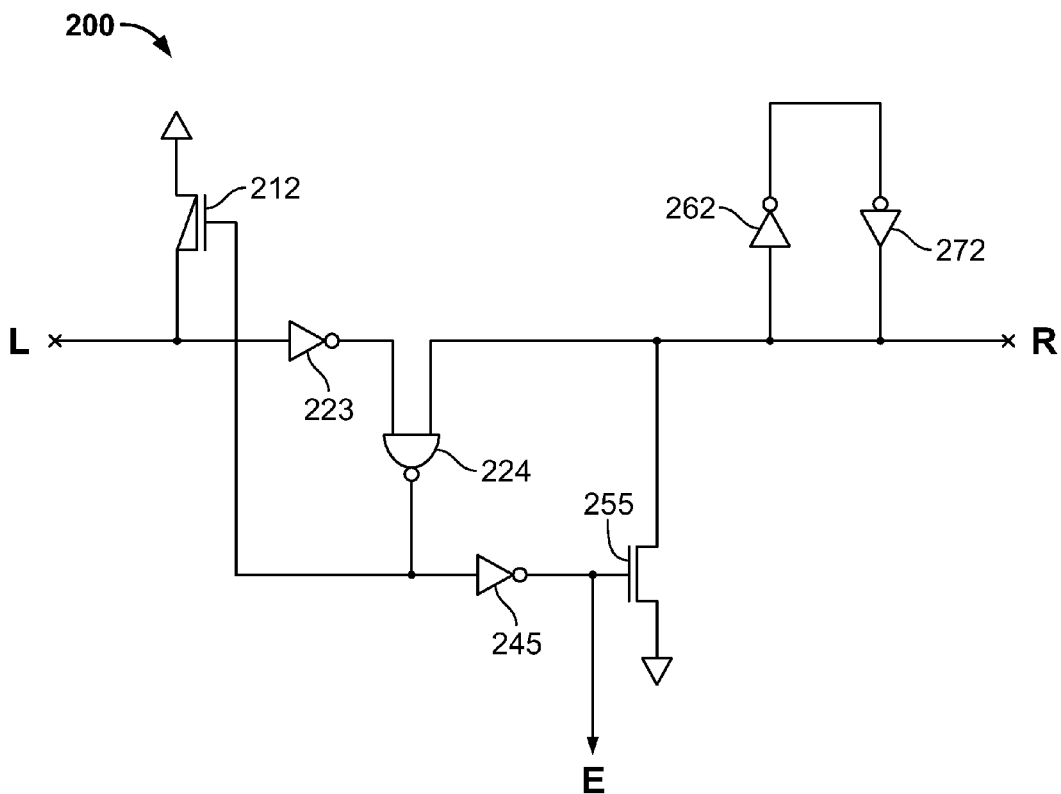
FIG. 2 shows a latch controller for a GasP handshaking pipeline stage, in accordance with some embodiments.
FIG. 3 shows a chart of signal values during the operation of one datum moving through each of three pipeline stages and its respective controller, such as the controller in FIG. 2, in accordance with some embodiments.

FIG. 2 shows latch controller 200 for a GasP handshaking pipeline stage, in accordance with some embodiments. Latch controller 200 may include NAND gate 224, output driver 255, inverter 245, keeper device 262/272, inverter 223, and input resetter/PFET pull-up transistor 212. In addition, latch controller 200 includes inter-stage wire (L) at the left pipeline stage, inter-stage wire (R) at the right pipeline stage, and latch enable output signal pin, E. As used herein, each of L and R may be referred to as a bidirectional signal pin. As used herein, NAND gate 224 may be referred to as a decision element.

NAND gate 224 may detect that the previous pipeline is FULL (e.g., with data) by having its input that has been inverted (by inverter 223) at a logic high level due to the inter-stage wire (L) at the left pipeline stage being at a logic LOW level (referred to as LOW herein) and the next pipeline stage is EMPTY (e.g., without data) by having its input that is coupled to the inter-stage wire (R) at the right pipeline stage at a logic HIGH level (referred to as HIGH herein). NAND gate 224 may output a LOW signal, which may turn on output driver 255 due to inverter 245 outputting a HIGH signal. In addition, the latch enable output signal pin, E, may be HIGH due to inverter 245 outputting a HIGH signal. When output driver 255 (connected to ground) is turned on, it may pull the wire to the next pipeline stage (R) to LOW, indicating that this stage is FULL and has accepted data, and PFET pull-up transistor 212 (connected to a power rail) may be turned on, pulling the wire to the previous pipeline stage (L) to HIGH, indicating that stage is EMPTY. In addition to turning on output driver 255, inverter 245 may also drive the transparent-high data latches (attached to controller 200) in the controlled pipeline data-path; this means the data latches will briefly become "transparent" (i.e., open) while the output driver is turned on.

The loop that includes NAND gate 224, inverter 245, and output driver 255 may ensure that the LOW output of NAND gate 224 may only be a pulse, resulting in the data latch being transparent only briefly and the output driver driving only briefly. In fact, this pulse may only need to be asserted long enough to ensure keeper device 262/272 has fully "flipped". Because the loop that includes NAND gate 224, inverter 245, and output driver 255 contains three gates and keeper device 262/272 has only one off-loop node, the pulse should be long enough to ensure that the keeper device has fully flipped, as long as the gates and transistors have been appropriately sized with the correct drive strengths. If controller design methodology from conventional GasP handshaking pipeline stage design (involving equalizing all of the gate delays) is followed, then the pulse should be long enough to ensure that the keeper device has fully flipped.

It should be noted that in conventional GasP handshaking pipeline stage design, NAND gate 224 may be implemented using self-resetting logic design rather than a full CMOS logic design. However, because a loop inside the self-resetting logic still contains three gates, the analysis and performance of either the logic design or the full CMOS design are similar.

FIG. 3 shows chart 300 of signal values during the operation of one datum moving through each of three pipeline stages and its respective controller, such as the controller in FIG. 2, in accordance with some embodiments. For example, the pipeline stages may be three stages of a GasP pipeline and their respective controllers. The values of signal pins L1, R1, L2, R2, L3, and R3 may be the values of the signals associated with those pins. For example, L1 and R1 may respectively be the left and right bidirectional signal pins of the first of the three stages of the pipeline. Similarly, L2 and R2 may respectively be the left and right bidirectional signal pins of the second of the three stages of the pipeline, and L3 and R3 may respectively be the left and right bidirectional signal pins of the third of the three stages of the pipeline. When the pipeline stage controllers are connected end-to-end, pins R1 and L2 and pins R2 and L3 are directly connected to each other. In chart 300, the "node" denotes the pin(s) through which signals are propagating. Therefore, chart 300 shows data propagating through each of the three controllers, where a "0" at a node indicates a LOW signal (indicating that the stage with which the node is associated is FULL), and a "1" at a node indicates a HIGH signal (indicating that the stage with which the node is associated is EMPTY). Chart 300 thus provides the relative propagation time of a piece of data moving through the three pipeline stages.

Figure 4:
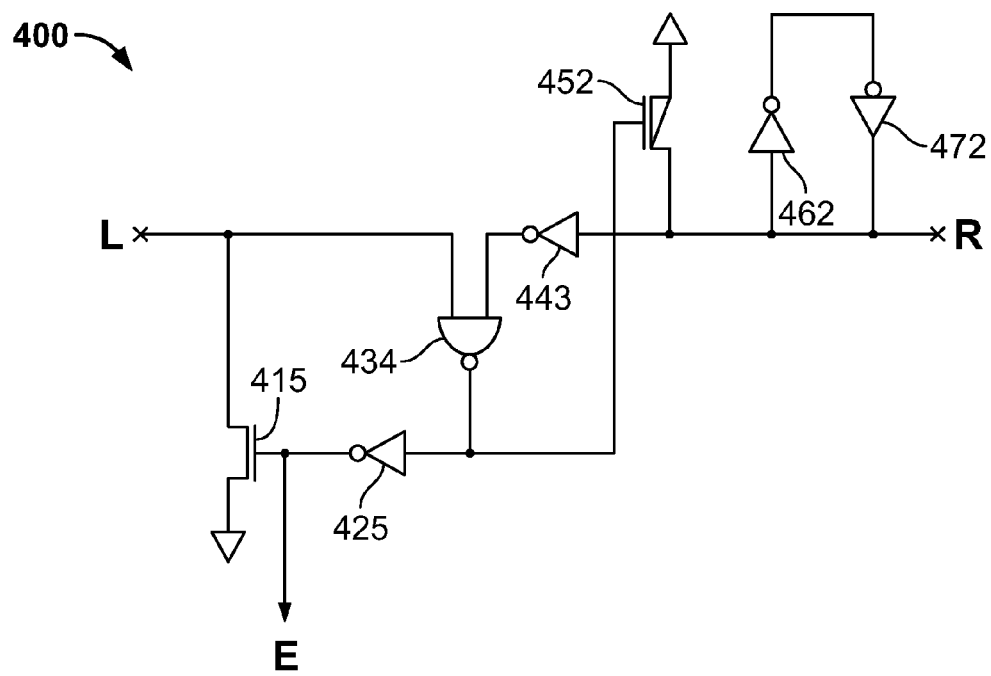
FIG. 4 shows a latch controller that may be similar to the one shown in FIG. 2, but with the polarity of the inter-stage wire flipped, in accordance with some embodiments.

FIG. 4 shows latch controller 400, which may be similar to the one shown in FIG. 2, but with the polarity of the inter-stage wire (the wire between L and R) flipped, in accordance with some embodiments. Latch controller 400 may include NAND gate 434, output driver 415, inverter 425, keeper device 462/472, inverter 443, and input resetter/PFET pull-up transistor 452. In addition, latch controller 400 includes inter-stage wire (L) at the left pipeline stage, inter-stage wire (R) at the right pipeline stage, and latch enable output signal pin, E. As used herein, each of L and R may be referred to as a bidirectional signal pin. As used herein, NAND gate 434 may be referred to as a decision element.

Because the polarity of the inter-stage wire of latch controller 400 has been flipped, the polarities of input resetter 452 and output driver 415 have been flipped. In addition, the locations of inverters in controller 400 have been moved from their locations shown in controller 200 of FIG. 2, to maintain and leave unchanged the polarities on the inputs of NAND gate 434 as compared to NAND gate 224 of FIG. 2.

In some embodiments, the design of controller 400 may be changed in such a way as to replace NAND gate 434 with a NOR gate (a decision element), while the inverters shown in controller 400 may be left in their place. In this design (that utilizes a NOR gate) the logical function of controller 400 may remain unchanged. However, the inversion of polarity in this design (that utilizes a NOR gate) may results in the forward latency (i.e., request in to request out), decreasing from four gate delays to two gate delays, and the reverse latency (i.e., acknowledge in to acknowledge out) increasing from two gate delays to four gate delays as compared to controller 200 of FIG. 2.

Figure 5:
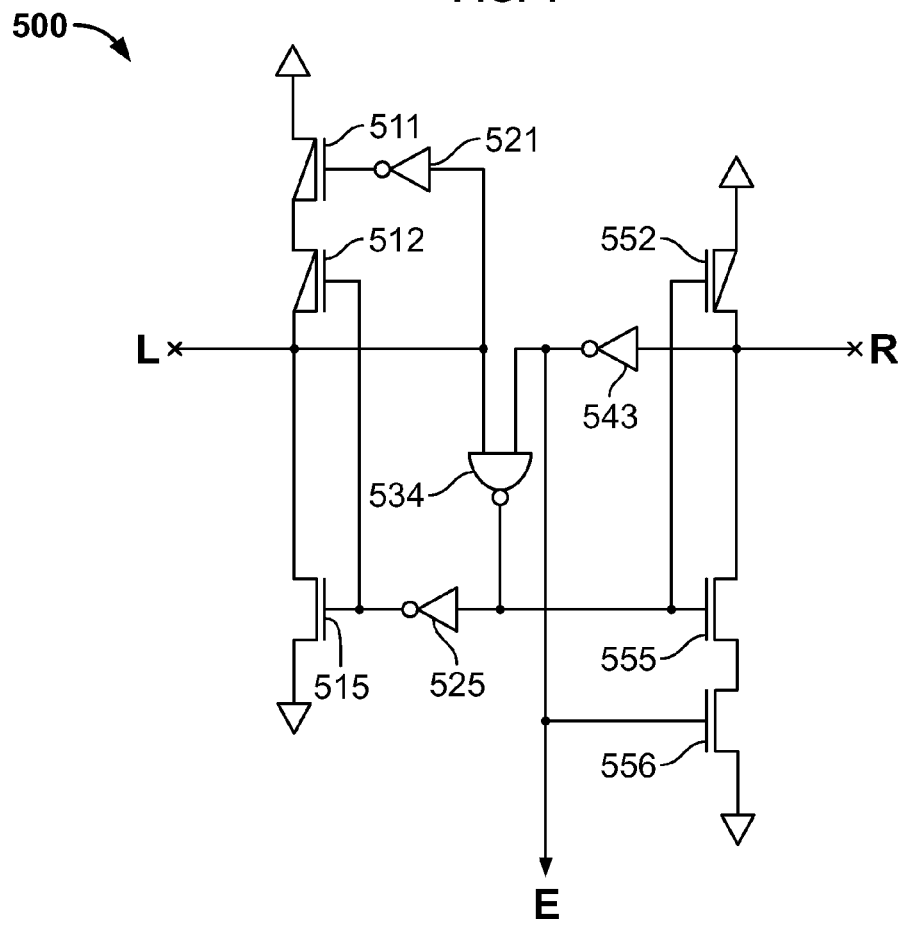
FIG. 5 shows the single-wire latch controller that incorporates tristatable half-latches on each port which avoid contention on the inter-stage wire, in accordance with some embodiments.

FIG. 5 shows the single-wire latch controller 500 that incorporates tristatable half-latches on each port that avoid contention on the inter-stage wire, in accordance with some embodiments. Latch controller 500 may include PFET transistor 511 (which may be referred to as a driving transistor), PFET transistor 512, NFET transistor/input resetter 515, NAND gate 534, NFET transistor 555, NFET transistor 556, and PFET transistor/output driver 552 (which may also be referred to as a driving transistor), and inverters 521, 525, and 543. Transistors 511 and 552 may be connected to power rails and transistors 515 and 556 may be connected to ground, as shown in FIG. 5. In addition, latch controller 500 includes inter-stage wire (L) at the left pipeline stage, inter-stage wire (R) at the right pipeline stage, and latch enable output signal pin, E. As used herein, each of L and R may be referred to as a bidirectional signal pin. As used herein, NAND gate 534 may be referred to as a decision element.

NAND gate 534 may function as a decision element that has as inputs the inverted value of R (inverted by inverter 543) and the value of L. NAND gate 534 may output a LOW value when both of its inputs are HIGH (i.e., the left inter-stage wire, L, is in a HIGH state, indicating that the previous pipeline stage is FULL with data, and the right inter-stage wire, R, is in a LOW state, indicating that the next pipeline stage is EMPTY without data). When NAND gate 534 outputs a LOW value, input resetter 515, which has its gate connected to the output of inverter 525, may be conducting and NFET transistor 555 may not be conducting. However, NAND gate 534 may output a HIGH value when either one of its two inputs is not HIGH. When NAND gate 534 outputs a HIGH value, input resetter 515, which has its gate connected to the output of inverter 525, may not be conducting and NFET transistor 555 may be conducting.

On the input side (at the inter-stage wire, L, at the left pipeline stage), PFET 511 and inverter 521 (which has its output connected to the gate of PFET 511) may form the cycle in a tri-stateable half-latch holding the left inter-stage wire, L, in a HIGH state. PFET 512, which may be a part of this tri-stateable half-latch, may function as a tri-state control, which disconnects the half-latch when input resetter 515 is conducting, as a result of the left inter-stage wire, L, being in a HIGH state, thus avoiding contention. PFET 512 may include a tri-state control pin to turn PFET 512 on (i.e., the half-latch connected to PFET 512 remains connected to L) or off (i.e., the half-latch connected to PFET 512 disconnects from L). The left inter-stage wire, L, may held in a LOW state by the half-latch in the previous latch controller to the left. L may be a pin that is connected to the inter-stage wire at the left pipeline stage.

On the output side (at the inter-stage wire, R, at the right pipeline stage), NFET 556 and inverter 543 may form the cycle in a tri-stateable half-latch holding the right inter-stage wire, R, in a LOW state. NFET 555, which may be a part of this tri-stateable half-latch, may function as a tri-state control, which disconnects the half-latch when output driver 552 is conducting, as a result of the right inter-stage wire, R, being in a LOW state, again avoiding contention. NFET 555 may include a tri-state control pin to turn NFET 555 on (i.e., the half-latch connected to NFET 555 remains connected to R) or off (i.e., the half-latch connected to NFET 555 disconnects from R). The right inter-stage wire, R, may be held in a HIGH state by the half-latch in the next latch controller to the right. R may be a pin that is connected to the inter-stage wire at the right pipeline stage.

As an improvement on previous designs, as shown in FIG. 5, the latch enable signal pin, E, may be the inverted version of the state of the right inter-stage wire, R. Thus, because E may be the inverted version of the state of the right inter-stage wire, any data latch to which latch controller 500 is connected may be transparent when the right inter-stage wire is in a LOW state and when the corresponding pipeline stage to the right is EMPTY (e.g., without data). It may be possible to use the output of inverter 525 as in GasP pipeline, however using the inverted version of the state of the right inter-stage wire for output E provides more relaxed timing.

Latch controller 500 may have a forward latency of two gate delays and a reverse latency of four gate delays. If, however, the circuitry of controller 500 were inverted in polarity (similar to what was done in redesigning the latch controller in FIG. 2 to be what is shown in FIG. 4, i.e., the latch controller may be inverted in polarity and the polarity of the inter-stage wires may be inverted) then a forward latency of four gate delays and a reverse latency of two gate delays may result due to the change in inverter positions.

Figure 6:
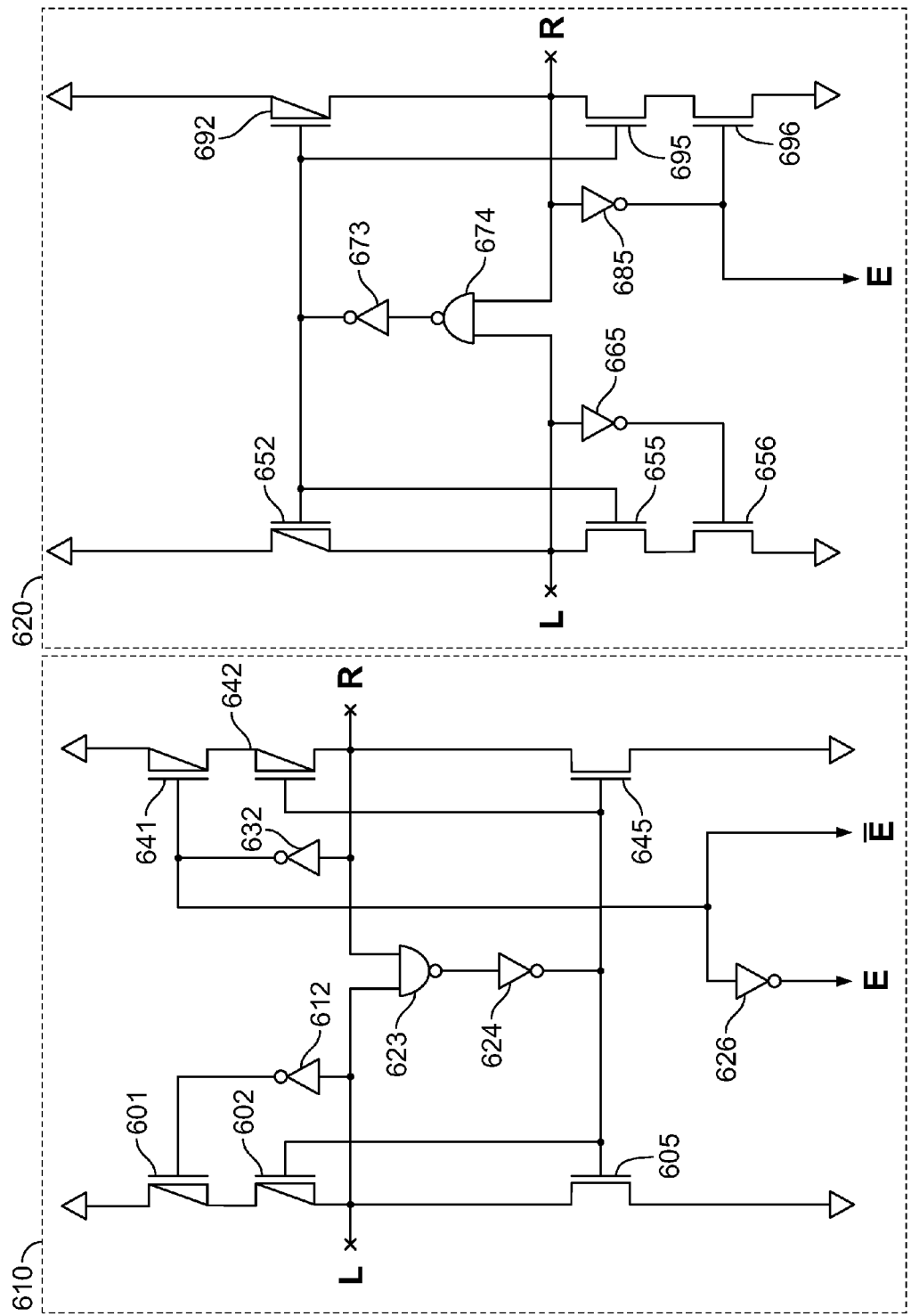
FIG. 6 shows two possible variants of the single-wire latch controller of FIG. 5 that incorporate tristatable half-latches on each port that avoid contention on the inter-stage wire, in accordance with some embodiments.

FIG. 6 shows two possible variants of the single-wire latch controller of FIG. 5 (latch controller 610 and latch controller 620) that incorporate tristatable half-latches on each port that avoid contention on the inter-stage wire, in accordance with some embodiments. The "N" type latch controller 610 on the left may include PFET transistors 601, 602, 641, and 642, NFET transistors 605 and 645, inverters 612, 624, 626, and 632, and decision element/NAND gate 623. PFET transistors 601 and 641 may each be referred to as a driving transistor. The "P" type latch controller 620 on the right may include NFET transistors 655, 656, 695, and 696, PFET transistors 652 and 692, inverters 665, 673, and 685, and decision element/NAND gate 674. PFET transistors 652 and 692 may each be referred to as a driving transistor. Transistors 601, 641, 652, and 692 may be connected to power rails and transistors 605, 645, 656, and 696 may be connected to ground, as shown in FIG. 6. In addition, latch controllers 610 and 620 may each include inter-stage wire (L) at the left pipeline stage, inter-stage wire (R) at the right pipeline stage, and latch enable output signal pin, E. As used herein, each of L and R may be referred to as a bidirectional signal pin. Each of the half-latches may include a tri-state control pin (similar to what is shown in FIG. 5), in addition to its bi-directional signal pin, to disconnect at least the half-latch's output from its bidirectional signal pin. As used herein, NAND gates 623 and 674 may each be referred to as a decision element.

In "N" latch controller 610 on the left, the left inter-stage wire, L, may be in a HIGH state when the corresponding pipeline stage, on the left, is FULL (e.g., with data). In "N"

latch controller 610, the right inter-stage wire, R, may be in a LOW state when the corresponding pipeline stage, on the right, is FULL (e.g., with data). However, in "P" latch controller 620 on the right, the polarities, as compared to the "N" latch controller 610, may be reversed.

In "P" latch controller 620 on the right, the left inter-stage wire, L, may be in a LOW state when the corresponding pipeline stage, on the left, is FULL (e.g., with data), and otherwise L may be in a HIGH state. In latch controller 620, the right inter-stage wire, R, may be in a HIGH state when the corresponding pipeline stage, on the right, is FULL (e.g., with data), and otherwise R may be in a LOW state. In an overall pipeline, the "N" type latch controller and the "P" type latch controller may have to alternate for proper function of the pipeline.

This arrangement may result in the forward and reverse latencies (for either the "N" type of latch controller or the "P" type of latch controller) being three gate delays. However, this latency may be at the expense of an extra inverter 626 included in every other (e.g., N type) stage of the pipeline. However, if in the design of the latch controllers, the polarity of the latch enable pin, E, on each bank of data latches alternated like the polarity of the latch controllers themselves, then this extra inverter may be eliminated.

Figure 7:
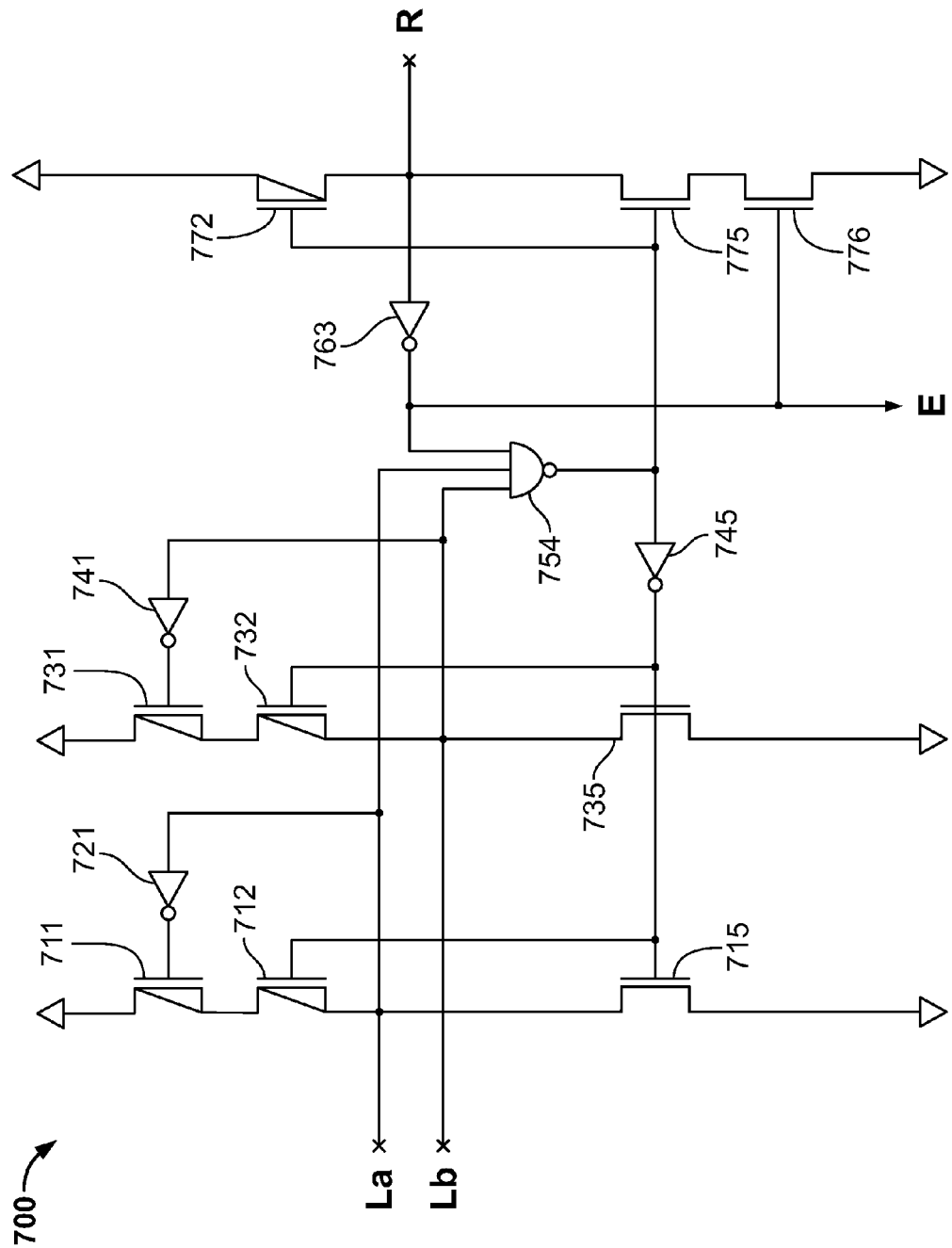
FIG. 7 shows another variant of the single wire latch controller of FIG. 5, in which the latch controller has been modified to accept handshaking from two up-stream latch controllers, in accordance with some embodiments.

FIG. 7 shows another variant (latch controller 700) of the single-wire latch controller of FIG. 5, in which the latch controller has been modified to accept handshaking from two up-stream latch controllers (connected to La and Lb), in accordance with some embodiments. Such a design modification may require an additional bidirectional pin, a driving and/or resetting transistor, a tri-stateable half-latch, and a third input on a NAND gate.

Latch controller 700 may include PFET transistors 711, 712, 731, 732, and 772, NFET transistors 715, 735, 775, and 776, NAND gate 754, and inverters 721, 741, 745, and 563. PFET transistors 711, 731, and 772 may each be referred to as a driving transistor. Transistors 711, 731, and 772 may be connected to power rails and transistors 715, 735, and 776 may be connected to ground, as shown in FIG. 7. In addition, latch controller 700 includes inter-stage wires (La and Lb) at the left pipeline stage, inter-stage wire (R) at the right pipeline stage, and latch enable output signal pin, E. As used herein, each of La, Lb, and R may be referred to as a bidirectional signal pin. As used herein, transistors 715 and 735 may be referred to as input resetters or resetting transistors and transistor 772 may be referred to as an output driver. As used herein, NAND gate 534 may be referred to as a decision element and may have as inputs the states of La, Lb, and the inverted version (via inverter 763) of R.

When comparing FIG. 7 to FIG. 5, transistors 711 and 731 may be similar in function to transistor 511, transistors 712 and 732 may be similar in function to transistor 512, transistors 715 and 735 may be similar in function to transistor 515, transistor 772 may be similar in function to transistor 552, transistor 775 may be similar in function to transistor 555, and transistor 776 may be similar in function to transistor 556. Inverters 721 and 741 may be similar in function to inverter 521, inverter 745 may be similar in function to inverter 525, and inverter 763 may be similar in function to inverter 543. NAND gate 754 may also be similar in function to NAND gate 534.

On the input side (at the inter-stage wires, La and Lb, at the left pipeline stage), PFET 711 and inverter 721 (which has its output connected to the gate of PFET 711) may form the cycle in a tri-stateable half-latch holding the left inter-stage wire, La, in a HIGH state. In addition, PFET 731 and inverter 741 (which has its output connected to the gate of PFET 731) may form the cycle in a tri-stateable half-latch holding the left inter-stage wire, Lb, in a HIGH state. On the output side (at the inter-stage wire, R, at the right pipeline stage), NFET 776 and inverter 763 may form the cycle in a tri-stateable half-latch holding the right inter-stage wire, R, in a LOW state. Each of the half-latches may include a tri-state control pin (similar to what is shown in FIG. 5), in addition to its bi-directional signal pin, to disconnect at least the half-latch's output from its bidirectional signal pin.

In another variant (not shown) of the single-wire latch controller of FIG. 5, the bidirectional wire port, R, on the right of latch controller 700, may be duplicated, allowing data to be properly sent to two down-stream latch controllers (coupled to La and Lb). In such a design (not shown), the latch enable signal, E, may connect (via an inverter) to an Inter-stage wire of the slowest down-stream stage, if one could be identified. In such a design (not shown) the latch enable signal, E, may be output as the NAND of all down-stream inter-stage wires, with this NAND possibly sharing logic with the existing decision element NAND already in the design.

It should be clear to those familiar with the art that numerous minor design variants of FIGS. 4, 5, and 6 may exist. Each of these design variants may include the idea of splitting a keeper device into two half latches, one at each end of the inter-stage wire, and each "keeping" a different binary value at its end of the wire at different times, all without contention.

Figure 8:
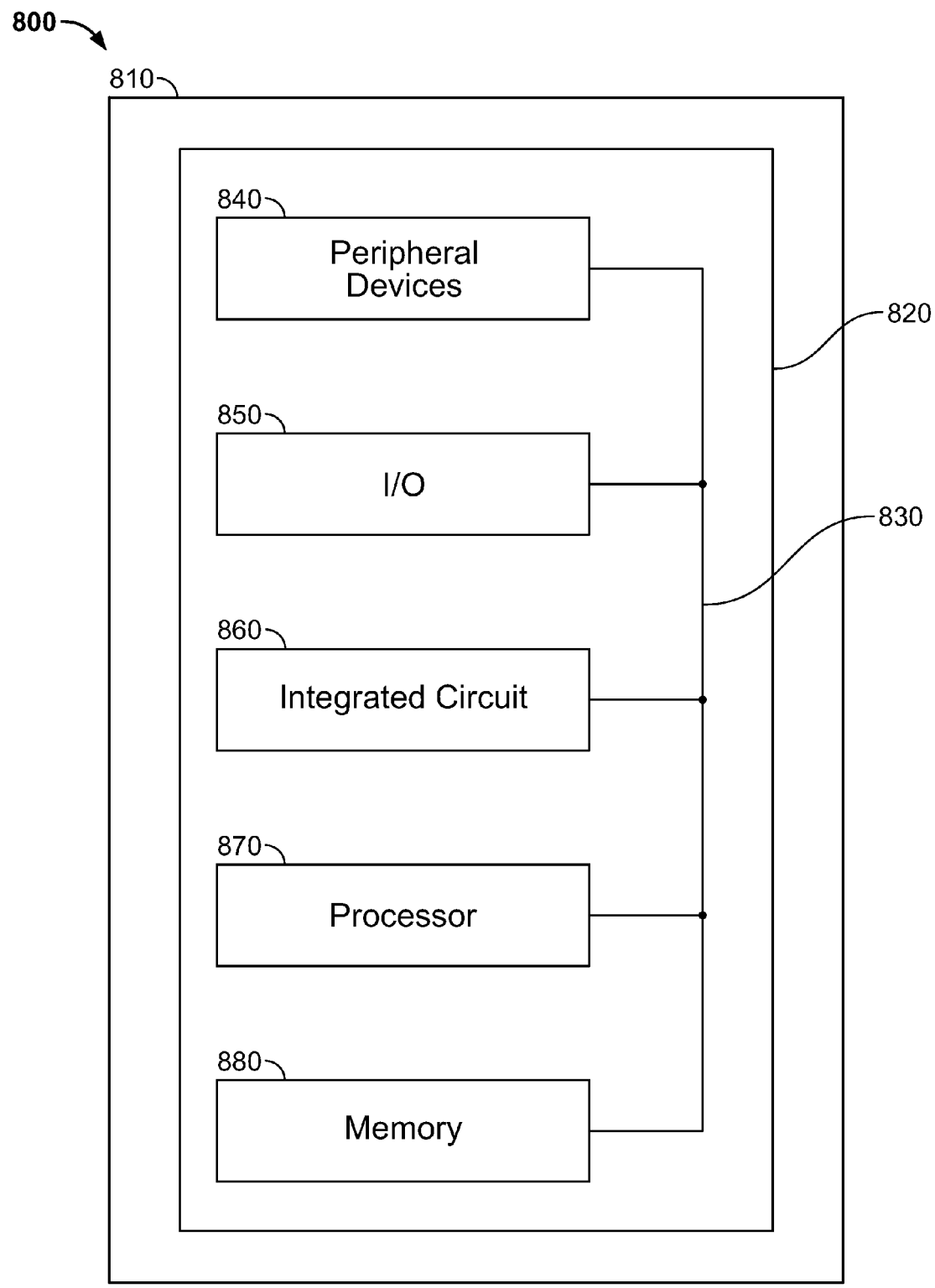
FIG. 8 is a simplified block diagram of an illustrative system employing an integrated circuit device incorporating aspects of the present disclosure, in accordance with some embodiments.

FIG. 8 illustrates a circuit or other device 860 that includes embodiments of a basic block module (e.g., of MACs), implemented using a data flow graph, which make use of the latch controllers and "keeper" devices as described herein as being within a data processing system 800. In an embodiment, integrated circuit or device 860 may be an integrated circuit, application specific standard product (ASSP), application specific integrated circuit (ASIC), programmable logic device (PLD), including a Field-Programmable Gate Array (FPGA), full-custom chip, or dedicated chip). In some embodiments, element 860 may include controllers 120, 200, 400, 500, 610, 620, and/or 700. Data processing system 800 may include one or more of the following components: circuit 860, processor 870, memory 880, I/O circuitry 850, and peripheral devices 840. These components are connected together by a system bus or other interconnections 830 and are populated on a circuit board 820 which is contained in an end-user system 810.

System 800 could be used in a wide variety of applications, such as computer networking, data networking, instrumentation, video processing, digital signal processing, or any other application where the advantage of using programmable or reprogrammable logic is desirable. Circuit 860 may be used to perform a variety of different logic functions. For example, circuit 860 may be configured as a processor or controller that works in cooperation with processor 870. Circuit 860 may also be used as an arbiter for arbitrating access to a shared resource in system 800. In yet another example, circuit 860 can be configured as an interface between processor 870 and one of the other components in system 800. It should be noted that system 800 is only exemplary, and that the true scope and spirit of the invention should be indicated by the following claims.

Although components in the above disclosure are described as being connected with one another, they may instead be connected to one another, possibly via other components in between them. It will be understood that the foregoing are only illustrative of the principles of the invention, and that various modifications can be made by those skilled in the art without departing from the scope and spirit of the invention. One skilled in the art will appreciate that the present invention can be practiced by other than the described embodiments, which are presented for purposes of illustration and not of limitation, and the present invention is limited only by the claims that follow.

The embodiments shown in this disclosure may save power and area, and in so doing, may also increase performance. Although these quantities may be easy to measure, the individual contributions of particular circuitry within the embodiments shown in this disclosure may be difficult to separate from contributions of other circuitry on any device or chip on which the circuitry are implemented.

Interactive interface applications and/or any instructions for layout of or use of the circuit designs of any the embodiments described herein may be encoded on computer readable media. Computer readable media includes any media capable of storing data. The computer readable media may be transitory, including, but not limited to, propagating electrical or electromagnetic signals, or may be non-transitory including, but not limited to, volatile and non-volatile computer memory or storage devices such as a hard disk, floppy disk, USB drive, DVD, CD, media cards, register memory, processor caches, Random Access Memory ("RAM"), etc.

It will be understood that the foregoing is only illustrative of the principles of the invention, and that various modifications may be made by those skilled in the art without departing from the scope and spirit of the invention, and the present invention is limited only by the claims that follow. For example, the various inventive aspects that have been discussed herein can either all be used together in certain embodiments, or other embodiments may employ only one or more (but less than all) of the inventive aspects. And if multiple (but less than all) of the inventive aspects are employed, that can involve employment of any combination of the inventive aspects. As another example of possible modifications, throughout this disclosure, particular numbers of components used in controllers are mentioned. These particular numbers are only examples, and other suitable parameter values can be used instead if desired.

What is claimed is:

1. A contention-free controller for a data latch, the controller comprising:
   first and second bidirectional signal pins;
   a decision element;
   a first driving transistor coupled between the first bidirectional signal pin and a power rail;
   a second driving transistor coupled between the second bidirectional signal pin and the power rail;
   a first tri-stateable half-latch coupled to the first bidirectional signal pin; and
   a second tri-stateable half-latch coupled to the second bidirectional signal pin,
   wherein the decision element is a gate comprising an input for the first bidirectional signal pin and an input for one of the second bidirectional signal pin and an inverted version of the second bidirectional signal pin.

2. The controller of claim 1 further comprising a plurality of inverters.

3. The controller of claim 1, wherein the first half-latch comprises a first tri-state control pin, and the second half-latch comprises a second tri-state control pin.

4. The controller of claim 3, wherein the first tri-state control pin controls the first half-latch to be disconnected from the first bidirectional signal pin, and wherein the second tri state control pin controls the second half-latch to be disconnected from the second bidirectional signal pin.

5. The controller of claim 4, wherein each of the first and second half-latches comprises at least an inverter, wherein the inverter connects a respective bidirectional pin of the respective half-latch to an internal state node.

6. The controller of claim 5, wherein the tri-state inverter of each of the first and second half-latches comprises a half tri-state inverter comprising two transistors.

7. The controller of claim 1, wherein the decision element is a NAND gate.

8. The controller of claim 1, wherein the decision element is a NOR gate.

9. The controller of claim 1, comprising a third bidirectional signal pin coupled to one of another up-stream latch controller and another down-stream latch controller.

10. The controller of claim 1, comprising a latch enable output pin.

11. A contention-free controller for a data latch, the controller comprising:
    a plurality of bidirectional signal pins;
    a latch enable output pin;
    a decision element;
    a plurality of tri-stateable half-latches coupled to the plurality of bidirectional signal pins,
    wherein the decision element is a gate comprising an input for a first bidirectional signal pin of the plurality of bidirectional signal pins and an input for one of a second bidirectional signal pin of the plurality of bidirectional signal pins and an inverted version of the second bidirectional signal pin of the plurality of bidirectional signal pins.

12. The controller of claim 11, wherein each of the plurality of half-latches comprises an inverter.

13. The controller of claim 11, wherein the latch enable output pin is input to the data latch.

14. The controller of claim 11, wherein each half-latch of the plurality of half-latches comprise a tri-state control pin.

15. The controller of claim 14, wherein each tri-state control pin of each half-latch of the plurality of half-latches controls the respective half-latch to be disconnected from one bidirectional signal pin of the plurality of bidirectional signal pins.

16. The controller of claim 11, wherein the decision element is a NAND gate.

17. The controller of claim 11, wherein the decision element is a NOR gate.

18. The controller of claim 11, wherein a third bidirectional signal pin of the plurality of bidirectional signal pins is coupled to one of another up-stream latch controller and another down-stream latch controller.

* * * * *